United States Patent [19]

Astor et al.

[11] Patent Number: 5,391,276
[45] Date of Patent: Feb. 21, 1995

[54] DEVICE FOR SCREENING OFF LINES OF ELECTRIC FLUX IN AN INSTALLATION FOR ELECTROLYTICALLY PROCESSING ESSENTIALLY FLAT ELEMENTS (III)

[75] Inventors: Kurt Astor, Hilpoltstein; Peter Haase, Feucht; Manfred Gute, Nürnberg, all of Germany

[73] Assignee: Atotech Deutschland GmH, Berlin, Germany

[21] Appl. No.: 108,690

[22] PCT Filed: Feb. 28, 1992

[86] PCT No.: PCT/DE92/00182

§ 371 Date: Oct. 28, 1993

§ 102(e) Date: Oct. 28, 1993

[87] PCT Pub. No.: WO92/15727

PCT Pub. Date: Sep. 17, 1992

[30] Foreign Application Priority Data

Mar. 2, 1991 [DE] Germany ............... 4106733

[51] Int. Cl.⁶ ............... C25D 17/06; C25D 17/16
[52] U.S. Cl. ............... 204/198; 204/225; 204/228; 204/242; 204/275; 204/286; 204/297 W; 204/DIG. 7
[58] Field of Search ............... 204/198, 225, 228, 242, 204/275, 286, 297 W, DIG. 7; C25D 17/00, 17/06, 17/16

[56] References Cited

U.S. PATENT DOCUMENTS 4,879,007 11/1989 Wong .................................. 205/15

FOREIGN PATENT DOCUMENTS

3726571C1 3/1989 Germany .
4005209A1 8/1991 Germany .
55-145199 11/1980 Japan .

*Primary Examiner*—Kathryn Gorgos
*Attorney, Agent, or Firm*—Cohen, Pontani, Lieberman, Pavane

[57] ABSTRACT

The invention relates to a device for screening off lines of electric flux in an installation for electrolytic processing of substantially plate-shaped material in the form of one or more workpieces which is held underneath a goods carrier and immersed in a bath when the goods carrier is lowered. A screen is provided which is adjustable in the vertical direction by a hold-down mechanism which is coupled with the movement of the goods carrier. The hold-down mechanism includes rods which project downward from the goods carrier to bear on two end regions of the screen. The lower ends of the rods and the end regions of the screen are constructed in such a way that the screen cannot be displaced relative to the rods at least in its longitudinal direction. The distance between the rods is greater than the width of the material to be processed which is located between the rods during processing. An apparatus is provided for transporting the screen from the lower working position into an upper parking position, the material to be processed hangs down from the goods carrier without lateral holders, and there are no guides between the bath vessel and screen.

21 Claims, 2 Drawing Sheets

DEVICE FOR SCREENING OFF LINES OF ELECTRIC FLUX IN AN INSTALLATION FOR ELECTROLYTICALLY PROCESSING ESSENTIALLY FLAT ELEMENTS (III)

BACKGROUND OF THE INVENTION

1. Field of the Invention

The invention relates to a device for screening off lines of electric flux in an installation for electrolytic processing of substantially plate-shaped material in the form of one or more workpieces which is held underneath a goods carrier and immersed in a bath when the goods carrier is lowered. A screen is provided which is adjustable in the vertical direction by hold-down means and screens off the above-mentioned lines of electric flux at the lower region of the material to be processed in the course of operation, the hold-down means being coupled with the movement of the goods carrier. Its preferred use is for electroplating printed circuit boards. The invention could also be used for processing other, similar workpieces and in other installations for electrolytic processing, e.g. for carrying out electrophoresis to apply thin, photo-sensitive films on printed circuit boards.

2. Discussion of the Prior Art

A device constructed for screening off lines of electric flux in an electroplating installation is disclosed in the subsequently published DE-OS 40 05 209 which describes, among other things, a construction with a lower pair of screens which arc constructed as floating bodies and arc situated on both sides of the lower region of a plate-shaped material to be electroplated. They are brought into the desired lower screening off position by hold-down means. Those hold-down means are fastened to frame rods, between which the plate shaped material to be electroplated is supported, and are moved down along with the downward movement of the goods carrier. However, the aforementioned screens which are constructed as floating bodies can only be moved up out of their lower position by a relatively short distance, since they are prevented from a continued upward movement by a stop. It is also possible to raise these lower screens in a corresponding manner by means of a pull cable. The lower screens mentioned above are also guided at the bath vessel so as to be adjustable in the vertical direction. This is also true of the upper screens which are likewise provided. DE-OS 40 05 209 mentions that the invention can be used when the workpieces to be electroplated are suspended at the goods carrier by clamps or the like or also in arrangements in which the workpieces to be processed are held between frame rods of carrying racks which are attached in turn to the goods carrier. However, the aforementioned construction of two bold-down means which press down the lower pair of screens is disclosed only in the form of two hold-down parts at frame rods of a carrying rack. In the subject matter of DE-OS 40 05 209, the force for moving the screens down is applied by the hold-down means, i.e. the plate-shaped material to be processed is not loaded by this force. However, a disadvantage consists in the relatively costly, bulky construction of the two screens and particularly in the requirement that the screens be guided in the bath vessel in the vertical direction by their ends.

Another device for screening off lines of electric flux in an electroplating installation is known from JP 55-145 199 A in Patent Abstracts of Japan, Sect. C, Vol. 5 (1981) No. 16 (C-41). In this case, a screen is provided in a shielding and positioning frame for such printed circuit boards in immersion electroplating installations. The screen is constructed like the ridge of a roof and is guided by lateral tabs into vertically extending slots of a holder. The "ridge" of this "roof" faces downward. In its initial position, this screen is situated on the surface or upper region of the bath. The printed circuit board to be processed is inserted from above into the interior of the "roof" by its lower edge and carries the screen down with it during the immersion process. This screen prevents so-called scorching, i.e. unwanted additional metallization deposits in the lower edge region of the aforementioned printed circuit board. This arrangement of the prior art has a number of disadvantages. The screen must be pressed down by way of the printed circuit board to be processed. But such printed circuit boards are often very thin so that they cannot transmit the forces required for pressing down without sustaining damage. In such cases, the printed circuit boards buckle outward under the influence of the pressing pressure, which can damage these sensitive boards and lead to deposits of irregular thickness on their convex and concave sides. An arrangement corresponding to the aforementioned screening off device is known from DE-PS 37 26 571. A similar arrangement with lateral guides of the screen at the bath vessel is known from U.S. Pat. No. 4,879,007.

SUMMARY OF THE INVENTION

The object upon which the present invention is based proceeds from a device as discussed above. While retaining the advantage achieved by the hold-down means, i.e. that the material to be processed is not acted upon by the force for pressing down the screens, a device according to the present invention is to be constructed so as to avoid the disadvantages of a guide of the screen in the bath vessel in a simple, space-saving construction.

This object is met in that the hold-down means are rods which project downward from the goods carrier and are constructed so as to bear on the two end regions of the screen, the lower ends of the rods and the end regions of the screen on which these ends of the rods bear being constructed in such a way that the screen cannot be displaced relative to the rods at least in its longitudinal direction. Furthermore, the distance between the rods is greater than the width of the material to be processed which is located between the rods during processing, and means are provided for transporting the screen from the lower working position into an upper parking position. Additionally, the material to be processed hangs down from the goods carrier without lateral holders, and there are no guides between the bath vessel and screen. The advantage of dispensing with guides of the screen at or in the bath vessel consists in that the space which they would otherwise occupy is now available. The space which is now available in the width direction of the vessel is used to accommodate the rods. Thus, the rods provide the advantage of pressing down the screen without requiring additional space. This force for moving the screen out of the parking position into the working position does not load the material to be processed. This is critically important particularly in the principle area of application of the invention, namely thin printed circuit boards, since these boards are, for practical purposes, incapable of absorbing or transmitting considerable forces acting in their longitudinal direction. When the goods carrier is lowered, the two rods with the screen and the material to be processed which is located between the rods are also moved down into the working position simultaneously. A further advantage in omitting the guides between the ends of the screen and the bath vessel consists in that such guides are difficult to arrange at the bath vessel, particularly in bath vessels produced from steel, which are commonly provided with an anti-corrosive coating. Such an anticorrosive coating has irregular thickness and also an irregular surface, for which reason they themselves are not suitable for guiding the screens. On the other hand, it would be difficult to fasten separate guide strips, e.g. of plastic, at surfaces of the bath vessel which are coated in this manner. According to the aforementioned teaching of the present invention, the function of the guides formerly provided at the bath vessels is taken over by the ends of the rods. Thus, these rods and their ends serve a dual purpose, namely to press the screen down into the working position and also to guide them. This is advantageous in terms of function and beyond this serves to simplify the construction and, as already mentioned, to save space inside the bath vessel. The material to be processed and the rods cannot collide with one another as the distance between the rods is greater than the width of the material to be processed. An added advantage is provided by the further teaching of the invention, that the material to be processed can hang down freely directly from the goods carrier without being held laterally, which also facilitates the attachment of the goods for electrolytic processing as well as the subsequent removal of the goods. The above-mentioned advantages also apply in comparison to the prior art according to JP 55-145 199A and DE-PS 37 26 571.

Further, means are provided for transporting and removing the screen from the lower working position into the upper parking position. Such means include constructing the screen as a float or providing flating bodies that bring the screen out of the working position in the bath liquid into the parking position. The screen can also be connected to weights or springs located outside the bath vessel which lift the screen into its parking position after the material has been processed and the rods have been raised.

In a further embodiment of the invention, the position of the screen in the upper parking position is secured and, the screen is secured against accidental shifting by simple abutments provided in the upper region of the bath for determining the upper parking position of the screen and holding it in this position. These abutments are narrow along the vertical and therefore have small longitudinal dimensions along the vertical. They need only be fastened at the upper edge of the vessel which does not come into contact with the bath liquid.

In another embodiment the screen can be guided and supported by the ends of the rods. In this embodiment, the end regions of the screen have stops or abutments at least in front of and behind the lower ends of the rods resting on the screen. The ends of the rods can also have a connection piece at their underside while the screen is provided with a slot for receiving the connection piece.

In yet another embodiment of the invention, the screen holds the lower region of the material to be processed in the working position for electrolytic processing by a slot so that it cannot shift out of this vertical position unintentionally.

In still a further embodiment, the base of the slot of the screen is situated lower than the lower front edge of the material to be processed when the material is held in the working position, so that the screen does not exert any pressure force against the lower region of the material to be processed.

Another embodiment of the invention includes directing means for the guidance of the screen by the rods and which facilitates the insertion of the workpiece into the screen.

In an additional embodiment, the rods are vertically adjustable at the goods carrier and can be fastened in the desired vertical position to allow adaptation to goods of different lengths.

Furthermore, in yet a further embodiment, the screen has longitudinal ribs and transverse plates which are located at least in end regions of the screen. The ribs and plates being made of an electrically non-conductive material.

BRIEF DESCRIPTION OF THE DRAWINGS

Further advantages are shown in the following description and pertinent drawings of embodiment examples according to the invention. The substantially schematic drawing shows.

DETAILED DESCRIPTION OF THE PREFERRED EMBODIMENT

Figure 1:
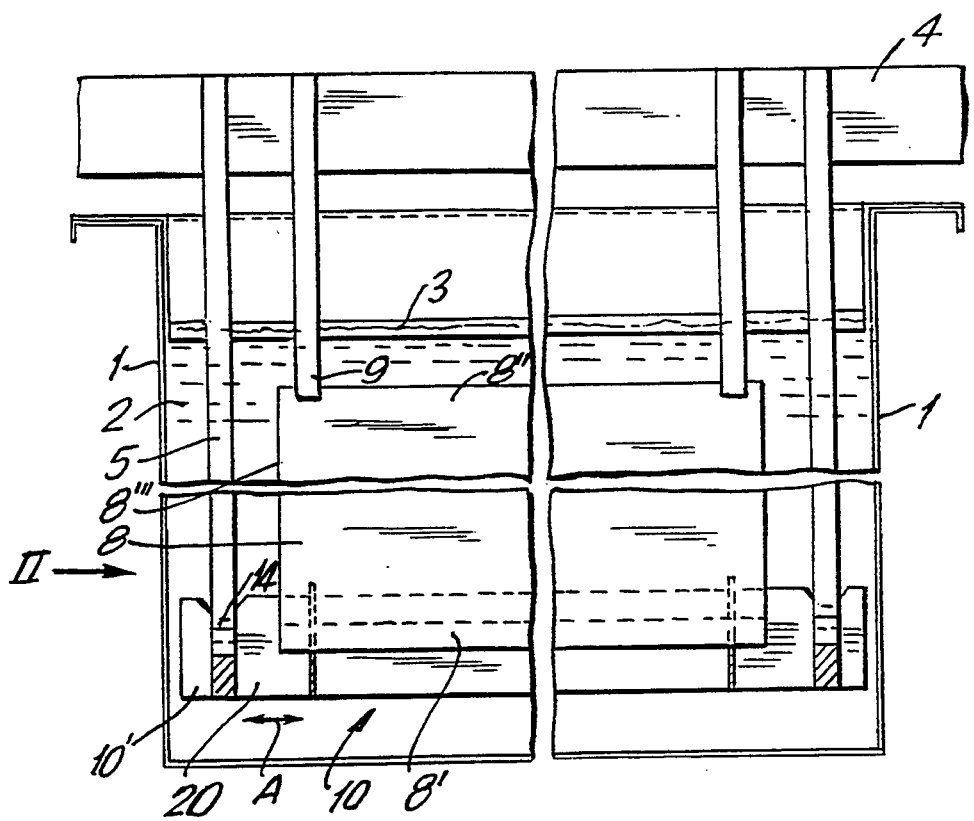
FIG. 1 is a side view of an arrangement according to the invention with the screen, rod and material to be processed in the working position.

A bath vessel 1, with a bath liquid 2, is shown in its entirety in FIG. 1 and partially in the remaining figures. The bath level is designated by 3. Two rods 5 are fastened to the goods carrier 4 and are immersed in the bath 2 when the goods carrier 4 is lowered and are pulled out of the bath 2 again when the goods carrier 4 is raised (see double arrow 7 in FIG. 3). The material 8 to be processed is detachably suspended, e.g. via indicated clamps 9, at the goods carrier 4, hangs down freely from the latter, and is likewise immersed in or pulled out of the bath 2 respectively along with the movement of the goods carrier 4 according to the double arrow 7. The material to be processed, which is shown in a general way and designated by 8, can be a single workpiece or can consist of a plurality of workpieces. The term "material to be processed" thus comprehends both of the above-mentioned possibilities.

Figure 2:
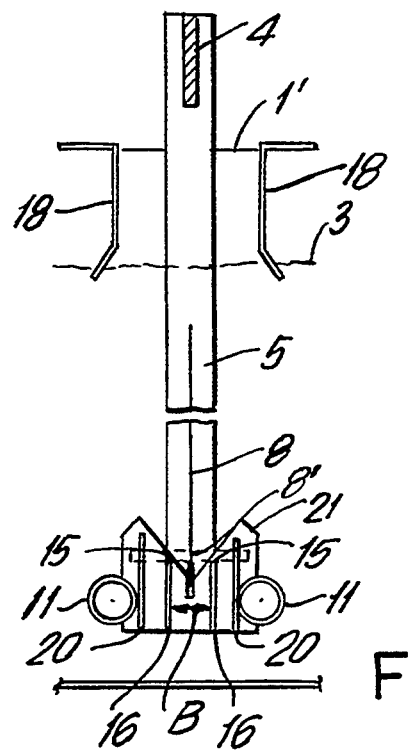
FIG. 2 is a front view of the arrangement in FIG. 1 according to arrow II in FIG. 1.

Further, a screen 10 is provided into which the lower region 8' of the material to be processed projects during the processing (see FIGS. 1 and 2). This prevents too many lines of electric flux from concentrating at the lower region 8' of the goods during the processing phase (position of parts according to FIGS. 1 and 2) and the formation of unwanted accumulations of material deposited as a result of the electrolytic, e.g. electroplating, process.

Figures 3, 4:
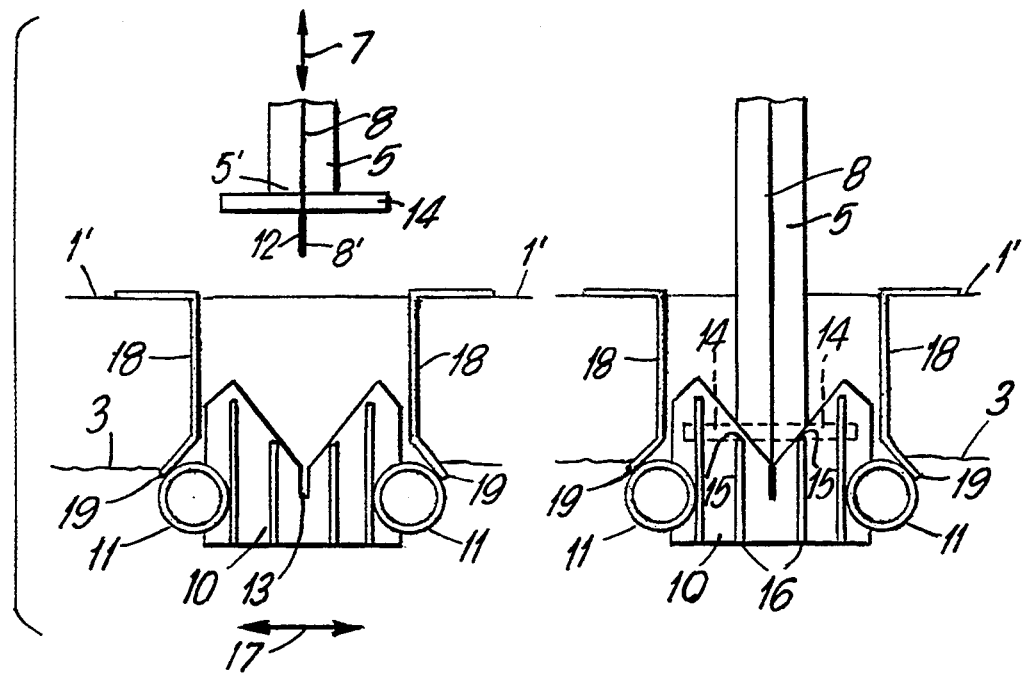
FIG. 3 shows only the screen in the parking position with a fully elevated rod as viewed from the front according to arrow II.
FIG. 4 is a front view analogous to FIG. 3, but in which the rod has moved downward into the parking position of the screen.

The screen 10 can be moved up and down in the vertical direction in order to arrive in the aforementioned working position according to FIGS. 1 and 2 in which it screens off a portion of the lines of electric flux relative to the lower region 8' of the goods. On the other hand, FIGS. 3 and 4 show the screen in the so-called parking position in which it is located in the upper region of the bath, e.g. in the preferred construction with attached floats 11 at the surface of the bath 2. FIG. 3 shows the uppermost position of one of the rods 5 (the goods carrier 4 is not shown in FIGS. 3 and 4). A connection piece 12 which fits into a slot 13 of the screen is arranged at the lower ends 5' of the rods. Also, two projections 14 are provided at the lower ends 5' of the rods and extend transversely to the longitudinal direction of the screen. When the goods carrier with the material 8 to be processed, e.g. a printed circuit board, is lowered, this results in a corresponding lowering of the rods 5. The latter then arrive in the slot 13 with their connection pieces 12 and the projections 14 come to rest on corresponding supports, e.g. upper end faces 15, of longitudinal ribs 16 of the screen. This position is shown in FIG. 4. When the goods carrier 4 is moved further downward, it moves the material 8 and the rods 5 downward parallel and synchronously relative to one another, but no pressing force is exerted on the material 8 to be processed. The rods 5 carry the screen 10 downward along with it out of its parking position in FIGS. 3 and 4 until reaching the working position according to FIGS. 1 and 2. In so doing, the material to be processed is held in its lower region 8' by a slot of the screen which approximately corresponds to and is flush with the slot 13 according to FIG. 3. The slot 13 and accordingly also the slot in the screen receiving the material to be processed project downward far enough so that the lower narrow front edge of the lower region 8' of the material to be processed does not strike against the base of the slot 13 or the base of the corresponding slot in the screen when the projections 14 come to rest on the longitudinal ribs 16. This ensures that no downwardly directed pressing force is exerted on the material to be processed when introducing this material 8 and particularly when processing it. The aforementioned downward elongation of the slots ensures that the plate-shaped material 8 cannot strike against the base of the slot.

The upper region 8" of the material 8 is held by suspension means, e.g. clamps 9. This has the advantage that the plate-shaped material 8 participates in the so-called goods movement of the goods carrier, i.e. a reciprocating movement of the goods carrier and of the material 8 in the direction of the double arrow 17 (see FIG. 3). However, the rods 5 also cause the screen 10 and the lower end of the material 8 to be processed to move along with them synchronously. The longitudinal ribs 16 and 20 can be provided with recesses so that the screen does not offer excessive resistance to the movement in the liquid. To achieve the screening off effect, the recesses in the screens 16 and 20 are offset relative to one another. The material 8 to be processed is prevented from warping in that its lower and upper regions 8', 8" are supported, even when long, relatively thin plates are concerned as is the case with the printed circuit boards mentioned above. The height (length) of the material to be processed can vary and, e.g. in the case of a plate-shaped material 8 which is shorter than that shown in FIG. 1, the lower edge 8' of the material and the rod are not moved down as far as would be necessary for processing a material having the length shown in FIG. 1. If necessary or if desired, the rods 5 can be vertically adjustable relative to the goods carrier 4 and can be fixed in the respective vertical position (not shown in the drawing). In this case, i.e. with plate-shaped material of varying length, the screen 10 occupies the position in which it shields the lower region 8' of the material against an excess of lines of electric flux in the working position. The longitudinal sides 8''' of the material to be processed are free of holders, but the rods 5 can be constructed, e.g. provided with shields, in such a way that they shield the lateral edges of the material 8 against excessive concentrations of lines of electric flux insofar as this is not effected in some other way. Such shields are particularly advantageous when the width of the material 8 to be processed varies.

Figure 5:
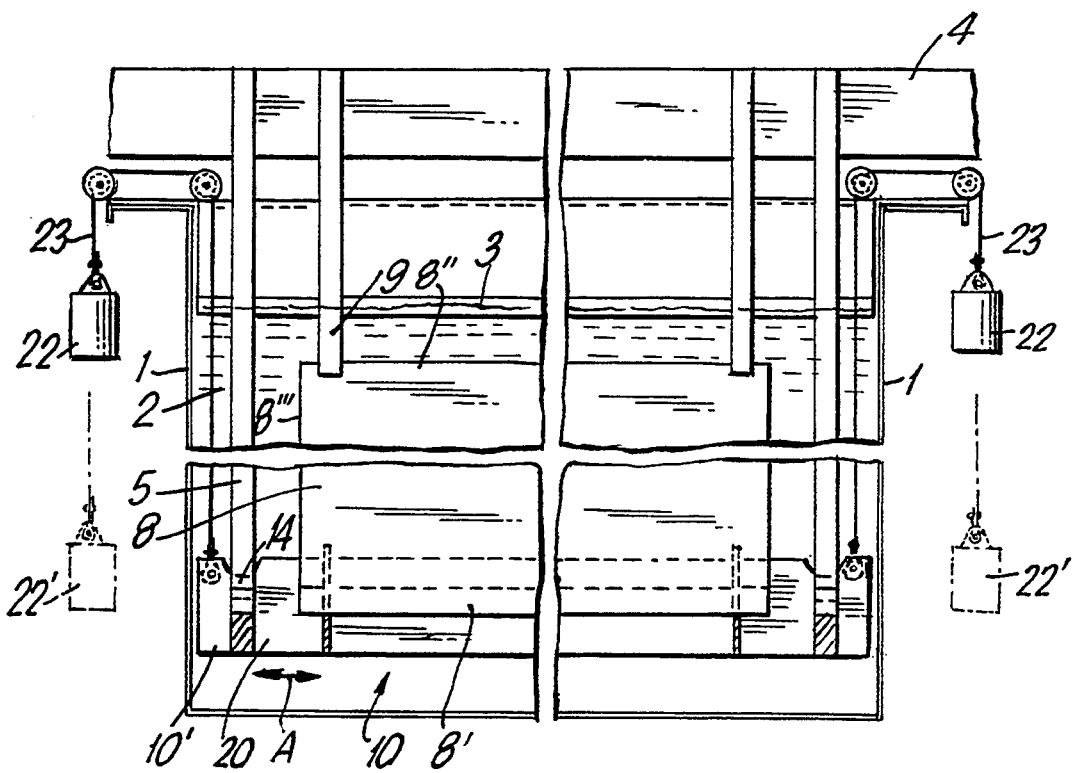
FIG. 5 shows another embodiment of the invention in a side view analogous to the side view of FIG. 1.

The screen 10 can be moved out of the working position according to FIGS. 1 and 2, e.g. by detachable drivers (not shown in the drawing) of the rods 5, and back up into the parking position of FIGS. 3 and 4 and held there by detachable means, likewise not shown in the drawing, at abutments 18 which are fastened at the edge 1' of the bath vessel 1. In a preferred construction which is particularly simple with respect to both design and function, the screen is constructed as a float or is provided with the floats already mentioned. In the illustrated embodiment, these floats are sealed, roughly tubular floating bodies 11 which are located at the longitudinal sides of the screen and are securely connected to them. The floating bodies 11 are dimensioned in such a way that they impart a buoyancy to the screen 10 which causes it to move from the working position into the parking position by itself. In the parking position of FIG. 3, the floats 11 come to rest at angles 19 of the abutments 18 and are accordingly held in the desired parking position automatically by their buoyancy. By raising the rods with connection pieces 12 and projections 14, the rods are moved out of the position according to FIG. 4 into the position according to FIG. 3 by the goods carrier. The processed material 8 is simultaneously raised along with them and can be moved further by the goods carrier. FIG. 5 shows another construction possibility of the invention in this respect. In this case, after the rods 5 are raised, the screen 10 is moved out of the working or processing position (upper position of the weights 22) into the upper parking position by means of weights 22 via pull cables 23. For the sake of simplicity, the drawing shows only the corresponding lower position 22' of the weights 22 for the upper parking position, but not the upper parking position of the screen.

The goods carriers with the material and rods are moved through the entire processing installation—from station to station—by means of a transporting device, not shown in the drawing.

The two end regions 10' of the screen 10 are suitably constructed for receiving the lower ends 5' of the rods, at least for the possibility of supporting them. Moreover, the construction of the ends 10' of the screen in this embodiment example, which has already been explained in part, in combination with a corresponding construction of the lower regions of the rods 5, is selected in such a way that the rods are immovably mutually supporting in the longitudinal direction A as well as in the transverse direction B of the screen (see FIGS. 1 and 2) when the rods bear on the screen. This is effected on the one hand in that the connection piece 12 engages in the slot 13 (for holding in the transverse direction B)

and on the other hand in that the screen is shaped so as to provide directing means with adjoining openings for the insertion of the ends of the rods and for holding their projections 14 in the longitudinal direction A.

The screen can include a series of longitudinal ribs 20 which are connected with one another at least in the end regions 10' by transverse plates 21. The longitudinal ribs 20 and the transverse plates 21 are produced from materials which are not electrically conductive, e.g. a plastic. They have the cut out portions or slots for receiving the lower region 8' of the material and also for supporting and holding the ends 5' of the rods for the purpose of preventing a displacement of the screen relative to the rods in directions A and B.

We claim:

1. A device for screening off lines of electric flux in an installation for electrolytic processing of substantially planar material which hangs down from a goods carrier and is immersed in a bath vessel containing a bath liquid when the goods carrier is lowered, the device comprising:

a screen which adjusts in a vertical direction and which screens off lines of electric flux at a lower region of the material to be processed, the screen having two end regions;

hold-down means for vertically adjusting the screen, the hold-down means moves with the goods carrier, the hold-down means including rods which project downward from the goods carrier to bear upon the two end regions of the screen, the rods having lower ends which are constructed together with the end regions of the screen so that the screen cannot be displaced relative to the rods at least in a longitudinal direction of the screen, the rods are spaced at a distance that is greater than the complete width of the material to be processed which is located between the rods during processing; and means for transporting the screen from a lower working position into an upper parking position so that the material to be processed hangs down from the goods carrier without lateral holders and so that no guides are present between the bath vessel and the screen.

2. A device according to claim 1, wherein the screen is constructed as a float which has a buoyancy that brings the screen out of the working position in the bath liquid into the parking position.

3. A device according to claim 1, wherein said means for transporting the screen from the working position into the parking position includes floating bodies which are connected to the screen and have a buoyancy that brings the screen out of the working position in the bath liquid into the parking position.

4. A device according to claim 3, wherein the screen has longitudinal sides, the floating bodies are arranged at the longitudinal sides of the screen to project out therefrom.

5. A device according to claim 1, wherein said transporting means includes weights arranged outside the bath vessel and connected to the screen by cables to lift the screen out of the working position into the parking position after the material has been processed and the rods have been raised.

6. A device according to claim 1, wherein the transporting means includes springs arranged outside the bath vessel and connected to the screen by cables to lift the screen out of the working position into the parking position after the material has been processed and the rods have been raised.

7. A device according to claim 1, and further comprising abutments provided in an upper region of the bath, the abutments having support faces for engaging the screen in the upper parking position, the abutments and support faces screening off lines of electric flux at an upper region of the material to be processed.

8. A device according to claim 1, and further comprising abutments provided in an upper region of the bath, the abutments having holding means for holding the screen in its upper parking position, the abutments and holding means screening off lines of electric flux at an upper region of the material to be processed.

9. A device according to claim 1, wherein the end regions of the screen on which the lower ends of the rods bear are provided with abutments which adjoin the lower rod ends at least in front of and behind the rod ends resting on the screen as viewed in the longitudinal direction of the screen.

10. A device according to claim 1, wherein the ends of the rods have an underside provided with a connection piece, the screen having a slot into which the connection piece of the rod ends is receivable.

11. A device according to claim 10, wherein the slot in the screen has a base that is situated lower than a lower front edge of the material to be processed when the material is held in the working position.

12. A device according to claim 10, wherein the lower ends of the rods have projections which extend transversely to the longitudinal direction of the screen, the device further comprising means for directing insertion of the lower rod ends, connection pieces and projections, the directing means are provided in the longitudinal direction of the screen and in a transverse direction of the screen, the directing means also directing insertion of the material to be processed into the slot of the screen.

13. A device according to claim 1, wherein the screen is provided with a slot in which a lower region of the material to be processed is held.

14. A device according to claim 13, wherein the slot of the screen has a base that is situated lower than a lower front edge of the material to be processed when the material is held in the working position.

15. A device according to claim 1, wherein the rods are provided to be vertically adjustable at the goods carrier and fastenable in a vertical position.

16. A device according to claim 1, wherein the screen has longitudinal ribs and transverse plates, the plates are located at least in end regions of the screen.

17. A device according to claim 16, wherein the longitudinal ribs and the transverse plates are made of an electrically non-conductive material.

18. A device according to claim 17, wherein the longitudinal ribs and transverse plates are made of a plastic material.

19. A device according to claim 16, wherein the longitudinal ribs include two sets of longitudinal ribs, the screen is provided in its longitudinal ribs with recesses to facilitate synchronous movement of the screen with the rods, the recesses of one set of longitudinal ribs are offset relative to the recesses of the other set of longitudinal ribs.

20. A device according to claim 1, wherein the rods are constructed so that they shield lateral edges of the material to be processed from an excessive concentration of lines of electric flux.

21. A device according to claim 1, wherein the rods are provided with shields arranged to shield lateral edges of the material to be processed from an excessive concentration of lines of electric flux.

* * * * *